United States Patent
Haas et al.

(10) Patent No.: US 9,448,885 B2
(45) Date of Patent: Sep. 20, 2016

(54) FORWARD ERROR CORRECTION WITH CONFIGURABLE LATENCY

(71) Applicant: Altera Canada Co., Toronto (CA)

(72) Inventors: Wally Haas, Mount Pearl (CA); Chuck Rumbolt, St. John's (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/728,588

(22) Filed: Jun. 2, 2015

(65) Prior Publication Data

US 2015/0261611 A1 Sep. 17, 2015

Related U.S. Application Data

(63) Continuation of application No. 14/139,402, filed on Dec. 23, 2013, now Pat. No. 9,063,872, which is a continuation of application No. 13/793,826, filed on Mar. 11, 2013, now Pat. No. 8,645,771, which is a continuation of application No. 12/954,784, filed on Nov. 26, 2010, now Pat. No. 8,413,026.

(51) Int. Cl.
| | |
|---|---|
| *H03M 13/00* | (2006.01) |
| *G06F 11/10* | (2006.01) |
| *H03M 13/15* | (2006.01) |
| *H03M 13/37* | (2006.01) |
| *G06F 11/07* | (2006.01) |

(52) U.S. Cl.
CPC ......... *G06F 11/1076* (2013.01); *G06F 11/076* (2013.01); *G06F 11/0751* (2013.01); *G06F 11/10* (2013.01); *G06F 11/102* (2013.01); *H03M 13/152* (2013.01); *H03M 13/3738* (2013.01); *H03M 13/6505* (2013.01); *H03M 13/618* (2013.01)

(58) Field of Classification Search
CPC ............... G06F 11/10; G06F 11/1076; G06F 11/0751; H03M 13/152; H03M 13/3738
See application file for complete search history.

(56) References Cited

U.S. PATENT DOCUMENTS

| | | | |
|---|---|---|---|
| 6,252,917 B1 | 6/2001 | Freeman | |
| 6,307,899 B1 * | 10/2001 | Starr | ......................... H04L 1/20 375/227 |
| 7,434,139 B2 | 10/2008 | Barton et al. | |
| 7,925,936 B1 | 4/2011 | Sommer | |

OTHER PUBLICATIONS

International Telecommunication Union, ITU-T Recommendation G.975.1, Feb. 2004, pp. 1 to 52.*
Benaissa et al., "Reconfigurable Hardware Architectures for Sequential and Hybrid Decoding," IEEE Transactions on Circuits and Systems—I: Regular papers, vol. 54, No. 3, Mar. 2007, pp. 555-565.

* cited by examiner

*Primary Examiner* — Shelly A Chase
(74) *Attorney, Agent, or Firm* — Fletcher Yoder, P.C.

(57) ABSTRACT

A method of performing forward error correction with configurable latency, where a configurable latency algorithm evaluates a target Bit Error Rate (BER) against an actual BER and adjusts the size of a configurable buffer such that the target BER may be achieved when utilizing the smallest buffer size possible. When errors are corrected without the utilization of each of the configurable buffer locations, the algorithm reduces the size of the buffer by y buffer locations; the algorithm may continue to successively reduce the size of said buffer until the minimum number of buffer locations are utilized to achieve the target BER. If the buffer locations have been reduced such that the buffer size is too small and the target BER cannot be achieved, the algorithm may increase the size of the buffer until the minimum number of buffer locations are utilized to achieve the target BER.

20 Claims, 1 Drawing Sheet

FORWARD ERROR CORRECTION WITH CONFIGURABLE LATENCY

CROSS-REFERENCE TO RELATED APPLICATIONS

This application is a continuation of U.S. patent application Ser. No. 14/139,402, filed Dec. 23, 2013 (now allowed), which is a continuation of U.S. patent application Ser. No. 13/793,826, filed Mar. 11, 2013 (now U.S. Pat. No. 8,645,771), which is a continuation of U.S. patent application Ser. No. 12/954,784, filed Nov. 26, 2010 (now U.S. Pat. No. 8,413,026), each of which is hereby incorporated by reference in its entirety.

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

1. Technical Field of the Invention

The present invention discloses a method of performing forward error correction with a configurable latency for digital communications systems.

2. Background of the Invention

Long-distance digital communication systems, such as optical submarine cable systems, are responsible for the transmission of significant amounts of data. This data is transmitted across great distances, often from continent to continent. During transmission, data can become corrupted from noise within transmission channels, faults in transmission or receiving devices, or data errors from reading from and writing to an elastic store. Therefore, Forward Error Correction (FEC) is employed to minimize the error probability of transmitted data.

Claude Shannon first suggested a maximum possible channel throughout which developed into a theorem of error correction describing the addition of redundant data to payload data for the correction of errors from channel noise or interference during transmission. This FEC increases the reliability of transmitted data by encoding a block of payload data with redundant data bits through an algorithm generated at the transmitter, which allows a decoder to determine if an error has occurred. The decoder employs the code generated by the encoder to identify what information, if any, has been corrupted by noise or interference during transmission, and the decoder can in turn correct these errors.

Typically, a FEC system architecture provides a fixed latency system, meaning that the architecture could be limited to the type of data application it can be utilized with. To allow the system to adapt for use with various data applications, a method of providing a configurable latency FEC is required.

SUMMARY OF THE INVENTION

The present invention discloses a method of performing forward error correction with configurable latency, where a configurable latency algorithm evaluates a target Bit Error Rate (BER) against an actual BER and adjusts the size of a configurable buffer such that the target BER may be achieved when utilizing the smallest buffer size possible.

The configurable latency algorithm begins by utilizing the maximum number of available buffer locations within the configurable buffer to achieve the target BER. When errors are corrected without the utilization of each of the configurable buffer locations, the algorithm reduces the size of the buffer by y buffer locations; the algorithm may continue to successively reduce the size of said buffer until the minimum number of buffer locations are utilized to achieve the target BER. If the buffer locations have been reduced such that the buffer size is too small and the target BER cannot be achieved, the algorithm may increase the size of the buffer until the minimum number of buffer locations are utilized to achieve the target BER.

DETAILED DESCRIPTION OF THE INVENTION

Figure 1:
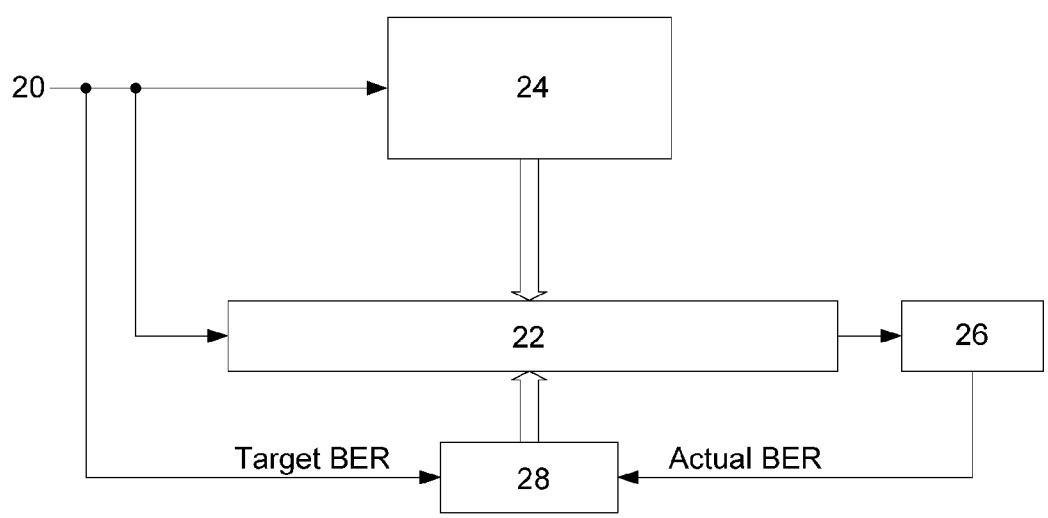
FIG. 1 illustrates a block diagram of the architecture of the present invention.
Figure 2:
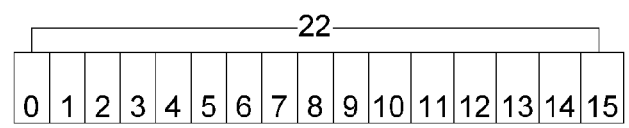
FIG. 2 illustrates a block diagram of an illustrative embodiment of the invention.

FIG. 1 depicts an illustrative embodiment of the present invention, whereby configurable buffer (22) is set to utilize the maximum number of buffer locations. For exemplary purposes, FIG. 2 illustrates configurable buffer (22) with 16 buffer locations, labeled 0-15. It should be noted that FIG. 2 is provided for exemplary purposes and is not meant to limit the scope of the invention, as any size buffer may be utilized. As illustrated in FIG. 1, input data (20) is transmitted into the system and written into configurable buffer (22), FEC block (24) and algorithmic logic block (28), where algorithmic logic block (28) represents the configurable latency algorithm. Data input (20) includes a target BER; when given this Target BER, the algorithmic logic block (28) starts by utilizing the maximum number of configurable buffer (22) locations to achieve the target BER.

As data is input to the system, FEC block (24) is able to act upon the data as it is transmitted through configurable buffer (22). As illustrated, data corrected by FEC block (24) is output from configurable buffer (22) into error monitor (26). Error monitor (26) evaluates the actual BER and inputs the actual BER into algorithmic logic block (28), allowing algorithmic logic block (28) to compare the target BER and actual BER such that the algorithmic logic block (28). The configurable latency algorithm of algorithmic logic block (28) is now able to determine the amount of buffer locations and the amount of latency required to output the correct BER and can effectively conFIG. the number of locations required in configurable buffer (22).

If the data travels through configurable buffer (22) such that the target BER is achieved without utilizing each of the configurable buffer (22) locations, the configurable latency algorithm of algorithmic logic block (28) reduces the number of configurable buffer (22) locations utilized by x and begins the process again. This process is repeated to reduce the number of locations of configurable buffer (22) to the minimum buffer size. Once errors occur, or the data travelling through configurable buffer (22) cannot achieve the target BER, the configurable latency algorithm increases the number of locations of configurable buffer (22) by y. It should be noted that x does not have to be the same value as y.

An illustrative embodiment of the present invention employs FEC in the form of a Bose Ray-Chaudhuri (BCH) (1023, 993) parent code, shortened to BCH (1000, 970), BCH codes are cyclic, error-correcting, digital codes of variable lengths which are able to correct errors in transmitted data. BCH codes typically employ a polynomial over a finite field, and a BCH codeword consists of a polynomial that is a multiple of the generator polynomial. The illustrative embodiment of the present invention operates on an m=10 Galois field with a t=3 value, where t represents the number of errors that can be corrected within a row code or a column code. It should be noted that this example is provided for illustrative purposes only and is not meant to limit the scope of the invention, as other FEC codes may be utilized.

By utilizing this configurable latency architecture, the same FEC architecture can be adapted for use across communication channels of varying BERs, while still maintaining data integrity. Such adaptability is desirable where the same architecture can be adapted for use with various data applications.

We claim:

1. A method, comprising:
    storing data in locations of a configurable buffer;
    performing forward error correction on the data as it is transmitted through configurable buffer; and
    adjusting the locations based on a comparison between a target error rate and a computed error rate, wherein the computed error rate is computed based on the forward error correction of the stored data.

2. The method of claim 1, wherein the adjusting the locations comprises reducing a number of the locations if the computed error rate is less than or equal to the target error rate.

3. The method of claim 1, wherein the adjusting the locations comprises increasing a number of the locations if the computed error rate is greater than the target error rate.

4. The method of claim 1, wherein the locations are adjusted until the computed error rate is substantially equal to or less than the target error rate.

5. The method of claim 1, wherein the locations are adjusted until a minimum number of locations is reached that results in the computed error rate being substantially equal to or less than the target error rate.

6. The method of claim 1, wherein a number of the locations of the configurable buffer corresponds to a size of the configurable buffer.

7. The method of claim 1, wherein the forward error correction code is a Bose Ray-Chaudhuri (BCH) code.

8. An apparatus, comprising:
    a configurable buffer, wherein locations of the configurable buffer store data;
    a forward error correction block configured to perform forward error correction on the data as the data is transmitted through the configurable buffer; and
    logic circuitry configured to adjust the locations based on a comparison between a target error rate and a computed error rate, wherein the computed error rate is computed based on the forward error correction of the stored data.

9. The apparatus of claim 8, wherein the logic circuitry adjusts the locations by reducing a number of the locations if the computed error rate is less than or equal to the target error rate.

10. The apparatus of claim 8 wherein the logic circuitry adjusts the locations by increasing a number of the locations if the computed error rate is greater than the target error rate.

11. The apparatus of claim 8, wherein the locations are adjusted until the computed error rate is substantially equal to or less than the target error rate.

12. The apparatus of claim 8, wherein the locations are adjusted until a minimum number of locations is reached that results in the computed error rate being substantially equal to or less than the target error rate.

13. The apparatus of claim 8, wherein a number of the locations of the configurable buffer corresponds to a size of the configurable buffer.

14. The apparatus of claim 8, wherein the forward error correction code is a Bose Ray-Chaudhuri (BCH) code.

15. An apparatus for forward error correction, the apparatus comprising:
    a configurable buffer configured to store data;
    a forward error correction block configured to perform forward error correction on the data as the data is transmitted through the configurable buffer; and
    logic circuitry configured to adjust a size of the configurable buffer based on a comparison between a target error rate and a computed error rate, wherein the computed error rate is computed based on the forward error correction of the stored data.

16. The apparatus of claim 15, wherein the logic circuitry is configured to adjust the size by reducing the size if the computed error rate is less than or equal to the target error rate.

17. The apparatus of claim 15, wherein the logic circuitry is configured to adjust the size by increasing the size if the computed error rate is greater than the target error rate.

18. The apparatus of claim 15, wherein the size is adjusted until a minimum size is reached that results in the computed error rate being substantially equal to or less than the target, error rate.

19. The apparatus of claim 15, wherein the size of the configurable buffer corresponds to a number of locations of the configurable buffer that store the data.

20. The apparatus of claim 15, wherein the forward error correction code is a Bose Ray-Chaudhuri (BCH) code.

* * * * *